United States Patent
Kmetec et al.

(10) Patent No.: US 10,056,361 B2
(45) Date of Patent: Aug. 21, 2018

(54) LIGHTING DEVICE INCLUDING A THERMALLY CONDUCTIVE BODY AND A SEMICONDUCTOR LIGHT EMITTING DEVICE

(71) Applicant: Lumileds LLC, San Jose, CA (US)

(72) Inventors: Jeffrey Dellert Kmetec, San Jose, CA (US); Franklin Joseph Wall, Vacaville, CA (US)

(73) Assignee: LUMILEDS LLC, San Jose, CA (US)

( * ) Notice: Subject to any disclaimer, the term of this patent is extended or adjusted under 35 U.S.C. 154(b) by 0 days.

(21) Appl. No.: 15/122,599

(22) PCT Filed: Apr. 2, 2015

(86) PCT No.: PCT/IB2015/052428
§ 371 (c)(1),
(2) Date: Aug. 30, 2016

(87) PCT Pub. No.: WO2015/155647
PCT Pub. Date: Oct. 15, 2015

(65) Prior Publication Data
US 2017/0077077 A1  Mar. 16, 2017

Related U.S. Application Data

(60) Provisional application No. 61/975,966, filed on Apr. 7, 2014.

(51) Int. Cl.
*H01L 25/16* (2006.01)
*H01L 33/64* (2010.01)
(Continued)

(52) U.S. Cl.
CPC .......... *H01L 25/167* (2013.01); *H01L 25/162* (2013.01); *H01L 25/165* (2013.01);
(Continued)

(58) Field of Classification Search
CPC . F21K 9/00; F21V 29/70; F21V 15/01; H01L 25/167; H01L 25/162; H01L 25/165; H01L 33/483; H01L 33/58; H01L 33/642
See application file for complete search history.

(56) References Cited

U.S. PATENT DOCUMENTS

| 7,244,965 B2 | 7/2007 | Andrews et al. |
| 7,625,104 B2 | 12/2009 | Zhang et al. |

(Continued)

FOREIGN PATENT DOCUMENTS

| DE | 202007002129 U1 | 5/2007 |
| EP | 2660887 A1 | 11/2013 |

OTHER PUBLICATIONS

EPO as ISA, "International Search Report and Written Opinion" dated Jul. 23, 2015 from International Application No. PCT/IB2015/052428, filed Apr. 2, 2015, 14 pages.

*Primary Examiner* — Tucker J Wright
(74) *Attorney, Agent, or Firm* — Volpe and Koenig, P.C.

(57) ABSTRACT

A lighting device including a body (10). The body (10) includes a mounting area (11) with a plurality of conductive pads (50, 52) and an elongate member (16) extending from the mounting area (11). The mounting area (11) and the elongate member (16) are formed of a thermally conductive, electrically insulating material. The conductive pads (50, 52) are embedded in the thermally conductive, electrically insulating material. The device further includes a semiconductor light emitting device (12) disposed in direct contact with the body (10) in the mounting area (11).

20 Claims, 2 Drawing Sheets

(51) Int. Cl.
*H01L 33/48* (2010.01)
*H01L 33/58* (2010.01)
(52) U.S. Cl.
CPC ............ *H01L 33/483* (2013.01); *H01L 33/58* (2013.01); *H01L 33/642* (2013.01)

(56) References Cited

U.S. PATENT DOCUMENTS

| | | |
|---|---|---|
| 2008/0191219 A1 | 8/2008 | Villard et al. |
| 2009/0122514 A1* | 5/2009 | Yoon ........................ F21K 9/00 362/84 |
| 2011/0148270 A1 | 6/2011 | Bhairi |
| 2011/0248615 A1* | 10/2011 | Tsai .................... F21V 19/0055 313/46 |
| 2011/0249406 A1* | 10/2011 | Andrews ............... F21V 29/004 361/704 |
| 2011/0260185 A1 | 10/2011 | Izutani et al. |
| 2011/0316407 A1* | 12/2011 | Lin ....................... F21V 3/0436 313/46 |
| 2012/0313498 A1* | 12/2012 | Hsu ....................... F21V 29/004 313/46 |

* cited by examiner

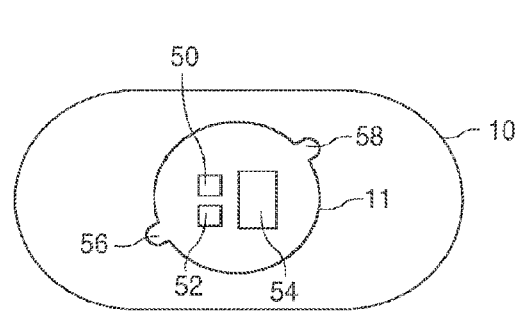
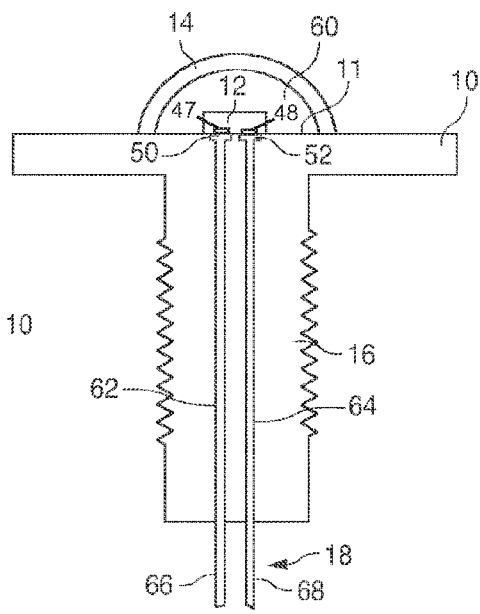
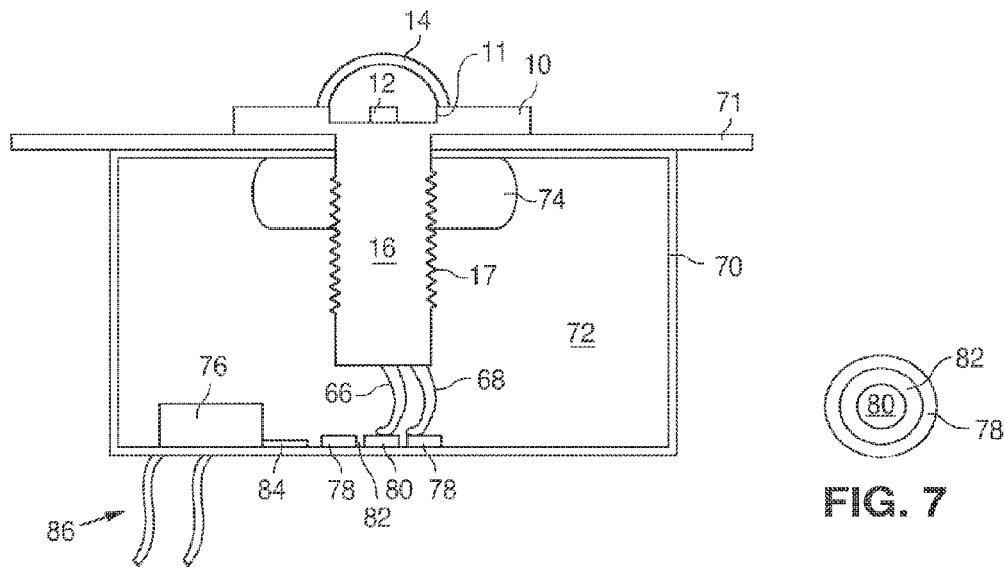
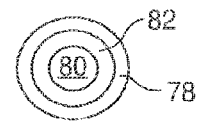

LIGHTING DEVICE INCLUDING A THERMALLY CONDUCTIVE BODY AND A SEMICONDUCTOR LIGHT EMITTING DEVICE

CROSS-REFERENCE TO RELATED APPLICATIONS

The present application is a § 371 application of International Application No. PCT/IB2015/052428 filed on Apr. 2, 2015 and entitled "LIGHTING DEVICE INCLUDING A THERMALLY CONDUCTIVE BODY AND A SEMICONDUCTOR LIGHT EMITTING DEVICE," which claims the benefit of U.S. Provisional Application No. 61/975,966, filed Apr. 7, 2014. International Application No. PCT/IB2015/052428 and U.S. Provisional Application No. 61/975,966 are incorporated herein.

FIELD OF THE INVENTION

The present invention relates to a lighting device including thermally conductive body.

BACKGROUND

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

FIG. 1 illustrates a slug 240 for mounting at least one LED to a heat sink, described in more detail in U.S. Pat. No. 7,625,104. LED dice 244 are mounted on a mounting portion 248 of the slug. The slug is formed from a thermally conductive material such as aluminum, steel, or copper, for example. The slug further includes a post 250. The post 250 includes a threaded portion 252 at a distal end of the post. A threaded nut 254 is received on the threaded portion 252 of the post 250.

The slug 240 is shown mounted to a heat sink 270. The heat sink 270 includes an opening 272 for receiving the post 250. A thermally conductive material 249 is disposed between a front surface 274 of the heat sink 270 and the mounting portion 248 of the slug. The slug 240 is secured to the heat sink 270 by engaging and tightening the threaded nut 254, thus causing the mounting portion 248 of the slug to be urged into thermal coupling with the front surface 274 of the heat sink 270. Conductors 260 and 262 extend past the end of the threaded portion 252 of the post 250, and facilitate connection to a current supply for supplying operating current to the LEDs 244.

The heat sink 270 has a cylindrical can-shaped body, which further acts as a light reflector and/or light guide for collecting and directing the light generated by the LED dice 244. The conductors 260 and 262 may be connected to a lighting fixture (not shown) on the ceiling of a room for suspending the LED apparatus. In other embodiments, the heat sink 270 may be a plate, or a heat sink having cooling fins, for example.

SUMMARY

It is an object of the invention to provide a lighting device that may be used with or without a separate heat sink.

In embodiments of the invention, a lighting device includes a body. The body includes a mounting area with a plurality of conductive pads and an elongate member extending from the mounting area. The mounting area and the elongate member are formed of a thermally conductive, electrically insulating material. The conductive pads are embedded in the thermally conductive, electrically insulating material. The device further includes a semiconductor light emitting device disposed in direct contact with the body in the mounting area.

In embodiments of the invention, a lighting device includes a body. The body includes a thermally conductive, electrically insulating material. A semiconductor light emitting device is mounted on the body. The body is configured to be attached to sheet metal without a heat sink.

BRIEF DESCRIPTION OF THE DRAWINGS

FIG. 4 is a top view of the body of the lighting device illustrated in FIG. 2.

FIG. 5 is a cross sectional view of the lighting device illustrated in FIG. 2.

FIG. 6 is a cross sectional view of a lighting device including circuitry such as driver circuitry.

FIG. 7 is a top view of the contact pads illustrated in cross section in FIG. 6.

DETAILED DESCRIPTION

Figure 1:
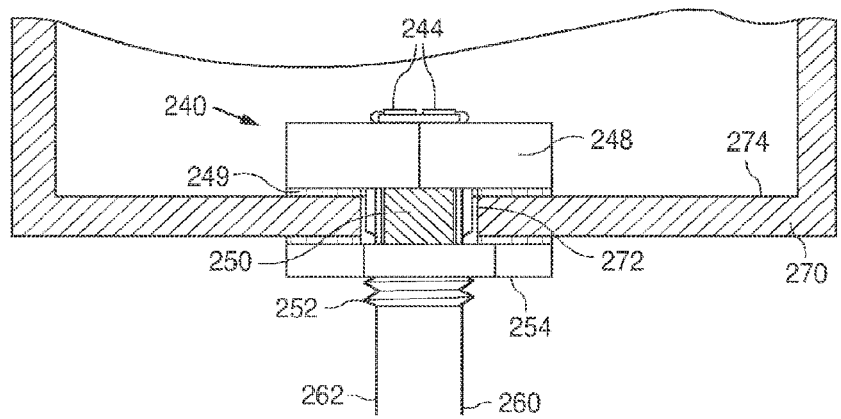
FIG. 1 illustrates LEDs attached to a slug that is mounted on a heat sink.

In the structure illustrated in FIG. 1, one or more LEDs 244 are attached to a slug with a threaded post 250. The slug must then be attached to a heat sink, which may be shaped into a light guide or reflector. In other words, in order to use the mounted LED illustrated in FIG. 1 most efficiently, the user or purchaser must be familiar with thermal management and optics, such that the user or purchaser can select an appropriate heat sink and/or reflector or light guide to install with the mounted LED of FIG. 1.

In embodiments of the invention, a lighting device such as an LED is mounted on a body that has sufficiently good thermal performance so that an external heat sink may not be required. A lens may be formed over the LED. Accordingly, a user or purchaser of the structure does not need any expertise in thermal management or optics. The mounted LED can be attached to a simple structure such as sheet metal.

Figure 2:
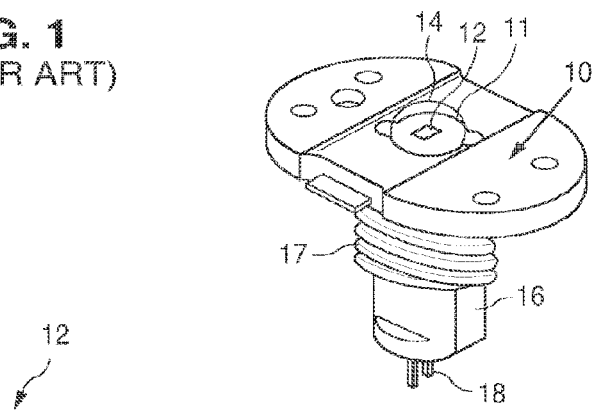
FIG. 2 illustrates a lighting device according to embodiments of the invention.

FIG. 2 illustrates an embodiment of the invention. A light emitting device 12 such as an LED is attached to a body 10. The light emitting device 12 is attached to conductive pads on a mounting area 11 on the top surface of the body. The top surface including the mounting area is shown in more detail in FIG. 4. A lens 14 may be formed over the light emitting device 12, as shown in FIGS. 5 and 6.

The body 10 includes an elongate member 16 extending from the mounting area 11. The elongate member 16 may be used to attach the body 10 to another structure such as sheet metal with a hole for accommodating elongate member 16. In some embodiments, as illustrated in FIG. 2, elongate member 16 may have a threaded surface 17. The threaded surface 17 may accommodate a nut (not shown in FIG. 2) for fastening body 10 to another structure. Though the example illustrated in FIG. 2 uses a threaded elongate member 16 and a nut to attach the body to another structure, any suitable structure for attaching the body to another structure may be used such as, for example, a twist-lock arrangement, a spring push-on arrangement, a rivet-based arrangement, or any other suitable mechanical attachment.

A structure 18 for providing electrical connection to the conductive pads in the mounting area of the body 10 is disposed at the end of elongate member 16. The electrical connection structure may be any suitable structure, including wires, metal spades lugs, metal posts, or any other suitable structure. In some embodiments, structure 18 is an insulation displacement connector or IDC, which can be integrated into body 10 at low cost.

Figure 3:
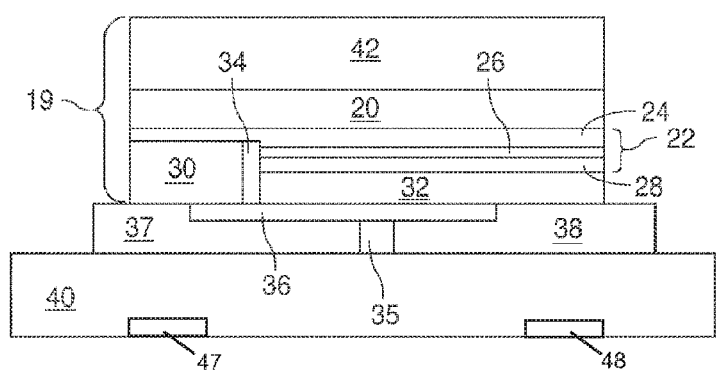
FIG. 3 illustrates an example of a semiconductor light emitting diode.

FIG. 3 illustrates one example of a III-nitride LED that may be used in embodiments of the present invention. Any suitable light emitting device 12 may be used and the invention is not limited to the example illustrated in FIG. 3. Though in the example of FIG. 3 the semiconductor light emitting device is a III-nitride LED that emits blue or UV light, semiconductor light emitting devices besides LEDs such as laser diodes and semiconductor light emitting devices made from other materials systems such as other III-V materials, III-phosphide, III-arsenide, II-VI materials, ZnO, or Si-based materials may be used.

The device of FIG. 3 is formed by growing a III-nitride semiconductor structure 22 on a growth substrate 20 as is known in the art. The growth substrate is often sapphire but may be any suitable substrate such as, for example, SiC, Si, GaN, or a composite substrate. A surface of the growth substrate on which the III-nitride semiconductor structure is grown may be patterned, roughened, or textured before growth, which may improve light extraction from the device. A surface of the growth substrate opposite the growth surface (i.e. the surface through which a majority of light is extracted in a flip chip configuration) may be patterned, roughened or textured before or after growth, which may improve light extraction from the device.

The semiconductor structure includes a light emitting or active region sandwiched between n- and p-type regions. An n-type region 24 may be grown first and may include multiple layers of different compositions and dopant concentration including, for example, preparation layers such as buffer layers or nucleation layers, and/or layers designed to facilitate removal of the growth substrate, which may be n-type or not intentionally doped, and n- or even p-type device layers designed for particular optical, material, or electrical properties desirable for the light emitting region to efficiently emit light. A light emitting or active region 26 is grown over the n-type region. Examples of suitable light emitting regions include a single thick or thin light emitting layer, or a multiple quantum well light emitting region including multiple thin or thick light emitting layers separated by barrier layers. A p-type region 28 may then be grown over the light emitting region. Like the n-type region, the p-type region may include multiple layers of different composition, thickness, and dopant concentration, including layers that are not intentionally doped, or n-type layers.

After growth, a p-contact 32 is formed on the surface of the p-type region 28. The p-contact 32 often includes multiple conductive layers such as a reflective metal and a guard metal which may prevent or reduce electromigration of the reflective metal. The reflective metal is often silver but any suitable material or materials may be used. After forming the p-contact 32, a portion of the p-contact 32, the p-type region 28, and the active region 26 is removed to expose a portion of the n-type region 24 on which an n-contact 30 is formed. The n- and p-contacts 30 and 32 are electrically isolated from each other by a gap 34 which may be filled with a dielectric such as an oxide of silicon or any other suitable material. Multiple n-contact vias may be formed; the n- and p-contacts 30 and 32 are not limited to the arrangement illustrated in FIG. 3. The n- and p-contacts may be redistributed with a dielectric/metal stack, as is known in the art.

The LED 19 may be attached to a mount 40. In order to form electrical connection between the LED 19 and the mount 40, one or more interconnects 37 and 38 are formed on or electrically connected to the n- and p-contacts 30 and 32. Interconnect 37 is electrically connected to n-contact 30 in FIG. 3. Interconnect 38 is electrically connected to p-contact 32. Interconnects 37 and 38 are electrically isolated from the n- and p-contacts 30 and 32 and from each other by dielectric layer 36 and gap 35. Interconnects 37 and 38 may be, for example, solder, stud bumps, gold layers, or any other suitable structure. Mount 40 may be, for example, silicon, ceramic, or any other suitable material. Electrical traces may be formed on the surface of or within mount 40 to electrically connect interconnects 37 and 38 to contact pads 47 and 48 on the bottom of mount 40 (not shown in FIG. 3). Contact pads 47 and 48 on the bottom of mount 40 may connect to contact pads formed in the mounting area 11 of body 10 as shown in FIG. 2 and as described below.

The substrate 20 may be thinned or entirely removed. In some embodiments, the surface of substrate 20 exposed by thinning is patterned, textured, or roughened to improve light extraction.

In some embodiments, one or more structures are attached to the semiconductor structure, if substrate 20 is removed, or to the side of substrate 20 opposite the semiconductor structure, if substrate 20 is present. The structure(s) may be, for example, optical elements such as lenses, filters, or wavelength converting members.

In the structure illustrated in FIG. 3, a wavelength converting member 42 is disposed over substrate 20. The wavelength converting member 42 includes a wavelength converting material which may be, for example, conventional phosphors, organic phosphors, quantum dots, organic semiconductors, II-VI or III-V semiconductors, II-VI or III-V semiconductor quantum dots or nanocrystals, dyes, polymers, or other materials that luminesce. The wavelength converting material absorbs light emitted by the LED and emits light of one or more different wavelengths. Unconverted light emitted by the LED is often part of the final spectrum of light extracted from the structure, though it need not be. Examples of common combinations include a blue-emitting LED combined with a yellow-emitting wavelength converting material, a blue-emitting LED combined with green- and red-emitting wavelength converting materials, a UV-emitting LED combined with blue- and yellow-emitting wavelength converting materials, and a UV-emitting LED combined with blue-, green-, and red-emitting wavelength converting materials. Wavelength converting materials emitting other colors of light may be added to tailor the spectrum of light extracted from the structure.

The wavelength converting member 42 may be a preformed wavelength converting member such as a wavelength converting ceramic tile or a wavelength converting material that is mixed with a transparent matrix such as glass or silicone, then diced into wavelength converting members. Alternatively, wavelength converting member 42 may be formed in situ on the LED 19. For example, wavelength converting material may be mixed with a transparent material such as silicone, epoxy, or any other suitable material, then dispensed, stenciled, screen printed, electrophoretically deposited, or otherwise disposed over the LED 19.

Many individual LEDs are formed on a single wafer then diced from a wafer of devices, before or after attaching the LED 19 to the mount 40, and before or after attaching wavelength converting member 42 to the LED 19.

Any suitable light emitting device may be used. The invention is not limited to the particular light emitting device illustrated in FIG. 3. The light emitting devices are represented in the following figures by block 12.

Returning to FIG. 2, the light emitting device 12 is mounted on the body 10 in mounting area 11 on the top surface of the body. The mounting area 11 is illustrated in more detail in FIG. 4. As shown in FIG. 4, mounting area 11 includes at least two conductive pads 50, 52 and thermal pad 54. Conductive pads 50 and 52 electrically connect to pads 47 and 48 on the bottom of mount 40 (illustrated in FIG. 3), to provide electrical connection to LED 19. One of conductive pads 50 and 52 electrically connects to the n-contact 30 shown in FIG. 3, and the other of conductive pads 50 and 52 electrically connects to the p-contact 32 shown in FIG. 3. Connection to n-contact 30 may be via pad 37. Connection to p-contact 32 may be via pad 38. Pads 50, 52, and 54 may be embedded in the electrically insulating, thermally conductive material that forms the body 10. Electrical isolation between pads 50 and 52 is provided by the material of the body 10.

Mounting area 11 may include a third pad 54, as illustrated in FIG. 4, which may be thermally conductive. The exposed portion of thermal pad 54 may be aligned with a structure on mount 40 that conducts heat away from LED 19. A portion of thermal pad 54 that is embedded within the body may be of sufficient size to conduct heat generated by the light emitting device 12 into the thermally conductive body 10. Body 10 further spreads the heat to enhance the thermal performance of the structure.

Mounting area 11 may be recessed relative to the rest of the top surface of body 10, though it need not be. In some embodiments, mounting area 11 is shaped to correspond to a lens or other optical element that is disposed over the lighting device 12. For example, in FIG. 4, mounting area 11 is shaped to correspond to a dome lens 14, as illustrated in FIG. 2.

In some embodiments, after the light emitting device 12 is attached to the pads 50, 52, and 54 in mounting area 11, and after a lens 14 (shown in FIG. 2) is disposed over the mounting area 11, the space between the light emitting device 12 and the lens may be filled with material. The filling material may protect the light emitting device 12, and/or aid in extraction of the light from the lighting device to the lens. In some embodiments, the filling material has an index of refraction no greater than the index of refraction of the light emitting device 12 and no less than the index of refraction of the lens 14. The mounting area 11 may include ports 56 and 58, which are used during injection of the filling material. The filling material may be injected into one of ports 56 and 58, and the other of ports 56 and 58 may be used to draw the air out of the space between the light emitting device and the lens, such that the filling material occupies as much of the space as possible.

Though the mounting area 11 is substantially round and the top surface of body 10 is oval in the embodiment illustrated in FIG. 4, these features may be any suitable shape. For example, mounting area 11 and/or the top surface of body 10 may be circular, oval, hexagonal, octagonal, square, or any other suitable shape.

FIG. 5 is a cross sectional view of the device illustrated in FIG. 2. As illustrated in FIG. 5, conductive pads 50 and 52, to which the lighting device 12 is attached, are embedded in body 10. Conductive pads 50 and 52 are connected to the external electrical connection structure 18 by conductive lines 62 and 64, disposed within the elongate member 16 of body 10. Conductive lines 62 and 64 may be, for example, metal wires. Elongate member 16 may be molded around conductive lines 62 and 64 such that conductive lines 62 and 64 are embedded in elongate member 16. Conductive line 62 connects conductive pad 50 to external connector 66. Conductive line 64 connects conductive pad 52 to external connector 68. External connectors 66 and 68 may be spring connectors or any other suitable structure.

FIG. 5 also illustrates the lens 14 disposed over the lighting device 12 in the mounting area 11. Material that aids the extraction of light or protects the light emitting device 12 may be disposed in the space 60 between lighting device 12 and lens 14. The material may be injected in space 60 using the ports 56 and 58 illustrated in FIG. 4 and described above.

In some embodiments, the mounting area 11 and elongate member 16 are a single, molded, integrated body 10. The single, molded, integrated body 10 may be formed of a thermally conductive, electrically insulating material. Examples of suitable materials include thermally conductive polymers such as Cool Polymers D3612 or any other suitable material. The thermally conductive, electrically insulating material may have a thermal conductivity of at least 6 W/mK in some embodiments, and no more than 25 W/mK in some embodiments.

The conductive structures that are embedded in the thermally conductive, electrically insulating material, such as pads 50, 52, and 54 and conductive lines 62 and 64, may be a material with good thermal conductivity, to further improve heat dissipation in the device. Examples of suitable materials include metals e.g. copper.

The light emitting device 12 mounted on body 10 may have a thermal resistance less than 10° C./W in some embodiments.

FIG. 6 illustrates an embodiment where circuitry is integrated into a fastener used to attach the body 10 to an external structure 71, such as sheet metal with a hole to accommodate elongate member 16. The fastener includes a housing 70 which encloses a cavity 72. A nut 74 or other suitable structure for attaching to body 10 is disposed at the top of chamber 72. For example, nut 74 may be glued or otherwise attached to the bottom surface of the top wall of housing 70. In embodiments where body 10 includes an elongate member 16 with a threaded surface 17, nut 74 receives threaded surface 17 to attach body 10 to the fastener. In other embodiments, nut 74 may be replaced by a slip over spring that engages elongated member 16 and provides positive engagement (i.e. pressure against) with the external structure 71.

Circuitry 76 is disposed within cavity 72. Circuitry 76 may be a pre-fabricated chip or any other suitable structure. Circuitry 76 may include, for example, driver circuitry, power conditioning circuitry, control circuitry, or circuitry that serves any other suitable purpose. Circuitry 76 may be disposed on a wall of housing 70. For example, a chip may be glued or otherwise attached to the bottom or side wall of housing 70.

Contact pads 78 and 80 are disposed on a surface of housing 70. Contact pads 78 and 80 align with spring connectors 66 and 68 that extend from the bottom of elongate member 16 of body 10. As the fastener is connected to elongate member 16 by rotating the fastener around body 10 until nut 74 engages with threaded portion 17 of elongate member 16, spring connector 66 touches contact pad 80 and spring connector 68 touches contact pad 78.

FIG. 7 is a top view of the contact pads 78 and 80, which are shown in cross section in FIG. 6. Contact pad 80 is a round pad, and contact pad 78 is a concentric ring around contact pad 80. Contact pads 78 and 80 are separated by a gap 82. As the fastener is twisted around elongate member 16, spring connector 66 rotates in place in contact with contact pad 80, while spring connector 68 rotates around in a circle around contact pad 80, in contact with ring-shaped contact pad 78.

Spring connectors 66 and 68 are electrically connected to the light emitting device 12 via contact pads disposed in the mounting area 11 of body 10, which are connected to conductive lines disposed within elongate member 16. The contact pads in the mounting area 11 and conductive members are not shown in FIG. 6 but are shown and described in FIG. 5 and accompanying text.

Contact pads 78 and 80 are connected to circuitry 76 by one or more conductive lines 84, which may be wires or any other suitable structure. Conductive lines 84 are typically disposed within cavity 72, though they need not be. Circuitry 76 is connected to one or more external connectors 86, which provide electrical connections to the circuitry in the fastener, and thereby to the light emitting device 12.

The embodiments described above may be used for any suitable purpose, including exterior lighting, appliance and cabinet lighting, room lighting, and spot lighting. The LEDs used are often high power devices, such that the device provides, for example, at least 100 lm in some embodiments and no more than 600 lm in some embodiments.

The embodiments described above may have advantages over conventional LED packages and mounts. As described above, the embodiments described above may not require a heat sink or lens to be applied by the end user, thus the user does not need to have any knowledge of thermal management or optics. The body 10 in the embodiments described above may be formed by available high volume, leadframe manufacturing, and thus may be inexpensive compared to other packages. IDC connectors, as described above, may be integrated into body 10 using leadframe manufacturing techniques. IDC connectors are simple, robust, reliable, and inexpensive connectors. The simple, mechanical connection is field-replaceable by an unskilled user.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

The invention claimed is:

1. A lighting device comprising:
    a body formed of a thermally conductive, electrically insulating material, the body including a top portion and an elongated member extending from the top portion, the elongated member being narrower than the top portion of the body;
    a plurality of conductive pads and a thermal pad embedded in the thermally conductive, electrically insulating material of the body and exposed at a mounting area on the top portion; and
    a semiconductor light emitting device disposed in the mounting area and connected to the body through the plurality of conductive pads and the thermal pad.

2. The lighting device of claim 1 wherein the lighting device has a thermal resistance less than 10° C./W.

3. The lighting device of claim 1 wherein the thermally conductive, electrically insulating material is a polymer.

4. The lighting device of claim 1 wherein the elongated member comprises a threaded portion.

5. The lighting device of claim 1 further comprising first and second electrical connectors protruding from an end of the elongated member opposite the mounting area, wherein the first and second electrical connectors are electrically connected to first and second conductive pads by first and second conductive lines, wherein the first and second conductive lines are embedded within the elongated member.

6. The lighting device of claim 1 further comprising a lens disposed over the semiconductor light emitting device and in direct contact with the body.

7. The lighting device of claim 1 further comprising a fastener for connecting to the elongated member, the fastener comprising a circuit.

8. The lighting device of claim 7 wherein:
    the fastener comprises a nut that engages with a threaded portion of the elongated member;
    first and second electrical connectors protrude from an end of the elongated member opposite the mounting area; and
    when the nut is engaged with the threaded portion of the elongated member, the first and second electrical connectors touch first and second electrical contact pads disposed on the fastener.

9. The lighting device of claim 1 further comprising a fastener for connecting to the elongated member and engaging a sheet including a hole through which the elongated member extends.

10. The lighting device of claim 1 wherein the body including the mounting area and the elongated member is a single, molded, integrated structure.

11. A lighting device comprising:
    a body comprising:
        a mounting area;
        an elongated member extending from the mounting area and including a threaded portion, the mounting area and the elongated member being formed of a thermally conductive, electrically insulating material;
        a plurality of conductive pads and a thermal pad embedded in the thermally conductive, electrically insulating material of the body; and
        first and second electrical connectors protruding from an end of the elongated member opposite the mounting area;

a semiconductor light emitting device comprising a light emitting diode disposed on a mount, the semiconductor light emitting device being disposed in direct contact with the body in the mounting area, the mount being connected to the body through the plurality of conductive pads and the thermal pad; and a fastener for connecting to the elongated member, the fastener comprising:
　a circuit;
　first and second electrical contact pads disposed on the fastener, the second electrical contact pad surrounding the first electrical contact pad; and
　a nut that engages with the threaded portion of the elongated member, the first and second electrical connectors being configured to touch the first and second electrical contact pads when the nut is engaged with the threaded portion of the elongated member.

12. The lighting device of claim 11 wherein the first and second electrical contact pads are electrically connected to the circuit.

13. The lighting device of claim 11 wherein the circuit in the fastener is selected from a group consisting of driver circuitry, power conditioning circuitry, and control circuitry.

14. The lighting device of claim 11 wherein the mounting area and the elongated member are parts of a single, molded, integrated structure.

15. A lighting device comprising:
　a body comprising a thermally conductive, electrically insulating material and including elongated member configured to fit through a hole in sheet metal;
　a semiconductor light emitting device mounted on the body, wherein the semiconductor light emitting device comprises a light emitting diode disposed on a mount, and wherein the mount is connected to the body through a plurality of conductive pads and a thermal pad disposed on a surface of the body; and
　a fastener for attaching the body to sheet metal without a heat sink.

16. The lighting device of claim 15 wherein the elongated member has threading that fits through a hole in sheet metal.

17. The lighting device of claim 15 wherein the elongated member comprises electrical connections, the fastener comprising a circuit electrically connected to contacts that engage with the electrical connections of the elongated member when the fastener connects to the elongated member.

18. The lighting device of claim 17 wherein the circuit in the fastener is selected from a group consisting of driver circuitry, power conditioning circuitry, and control circuitry.

19. The lighting device of claim 15 wherein the semiconductor light emitting device comprises contact pads that are directly attached to a plurality of conductive pads embedded in the thermally conductive, electrically insulating material.

20. The lighting device of claim 15 further comprising a lens disposed over the semiconductor light emitting device.

* * * * *